US006525605B2

United States Patent
Hu et al.

(10) Patent No.: US 6,525,605 B2
(45) Date of Patent: Feb. 25, 2003

(54) POWER AMPLIFIER SYSTEM HAVING FREQUENCY AND AMPLIFIER FAILURE COMPENSATION

(75) Inventors: Zhiqun Hu, Middletown, OH (US); Dmitiry Borodulin, Mason, OH (US)

(73) Assignee: Harris Corporation, Melbourne, FL (US)

( * ) Notice: Subject to any disclaimer, the term of this patent is extended or adjusted under 35 U.S.C. 154(b) by 62 days.

(21) Appl. No.: 09/747,559

(22) Filed: Dec. 23, 2000

(65) Prior Publication Data

US 2001/0003433 A1 Jun. 14, 2001

Related U.S. Application Data

(63) Continuation-in-part of application No. 09/137,643, filed on Aug. 19, 1998, now Pat. No. 6,188,277.

(51) Int. Cl.[7] .............................. H03G 5/16; H03F 1/36; H03F 3/68; H03F 21/00
(52) U.S. Cl. ................... 330/132; 330/107; 330/124 D; 330/207 P
(58) Field of Search ...................... 330/51, 132, 124 R, 330/124 D, 129, 136, 207 P, 107; 455/115, 117, 126

(56) References Cited

U.S. PATENT DOCUMENTS

| | | | |
|---|---|---|---|
| 4,165,493 A | * 8/1979 | Harrington | 330/207 P |
| 4,794,343 A | 12/1988 | Yang | 330/2 |
| 4,859,967 A | 8/1989 | Swanson | 330/298 |
| 5,111,166 A | 5/1992 | Plonka et al. | 333/128 |
| 5,121,077 A | 6/1992 | McGann | 330/149 |
| 5,126,704 A | 6/1992 | Dittmer et al. | 333/125 |
| 5,157,346 A | 10/1992 | Powell et al. | 330/151 |
| 5,256,987 A | 10/1993 | Kibayashi et al. | 330/295 |
| 5,438,683 A | 8/1995 | Durtler et al. | 455/74 |
| 5,884,143 A | 3/1999 | Wolkstein et al. | 455/13.4 |
| 6,160,449 A | * 12/2000 | Klomsdorf et al. | 330/149 |

* cited by examiner

Primary Examiner—Patricia Nguyen
(74) Attorney, Agent, or Firm—Tarolli, Sundheim, Covell, Tummino & Szabo L.L.P.

(57) ABSTRACT

A power amplifier system for use in amplifying an RF input signal exhibiting a given operating frequency within a known range of frequencies. The system includes a signal modulator that receives and modifies the input signal and provides therefrom a modified first signal. A power amplifier receives and amplifies the modified first signal. A first power detector detects the input signal and provides therefrom an average input power signal representative of the average input power thereof. A second power detector connected to the output of the amplifier provides an output average power signal representative of the average output power thereof. A controller adjusts the magnitude of said average input power signal and the magnitude of said average output power signal as a function of the operating frequency. The controller compares the adjusted said input average power signal and said adjusted output average power signal and controls said modulator in accordance therewith. Also, the amplifier includes a plurality of sub-amplifiers that are monitored for failure and adjustments are made to the average output power signal as needed.

26 Claims, 10 Drawing Sheets

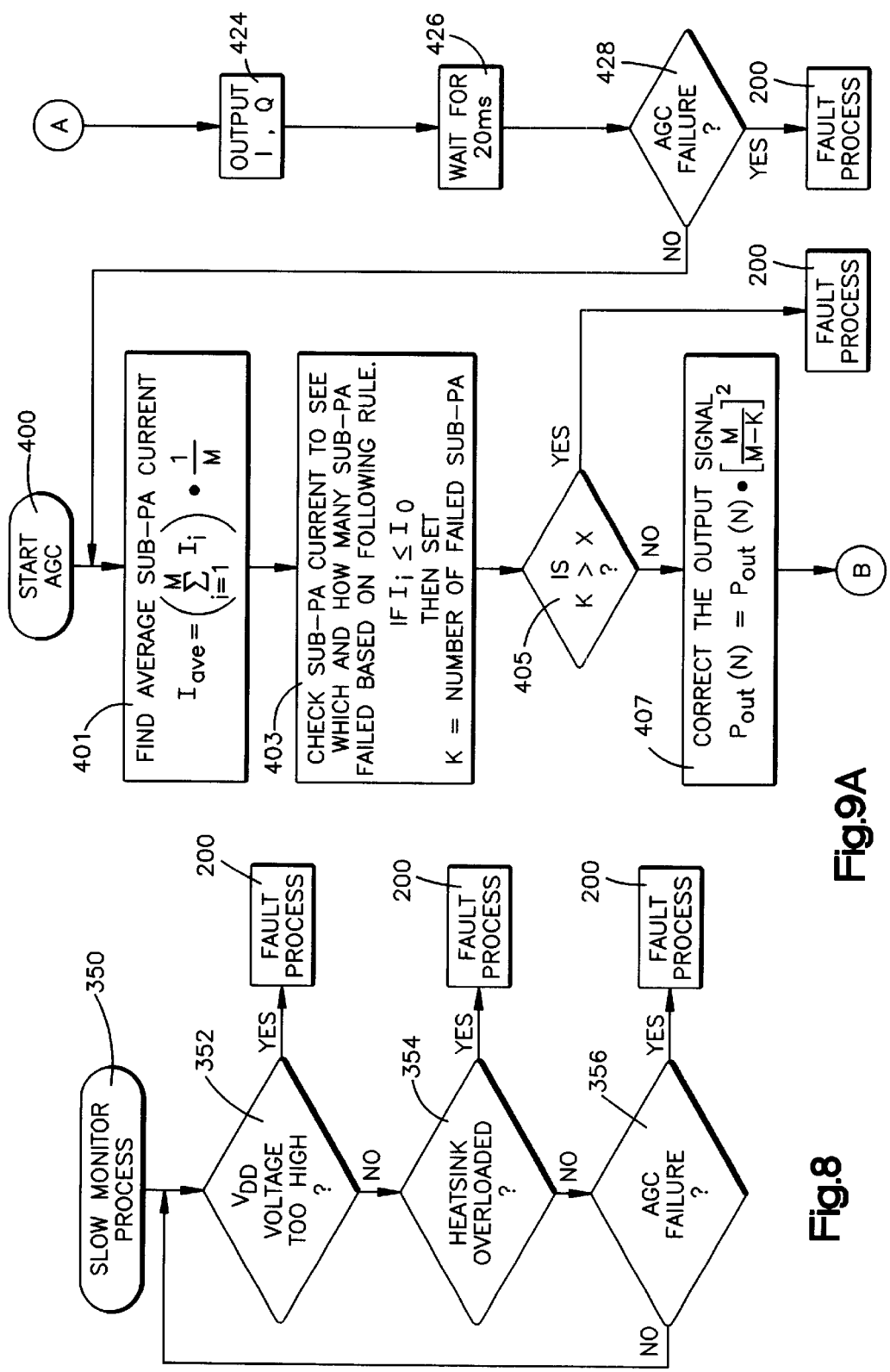

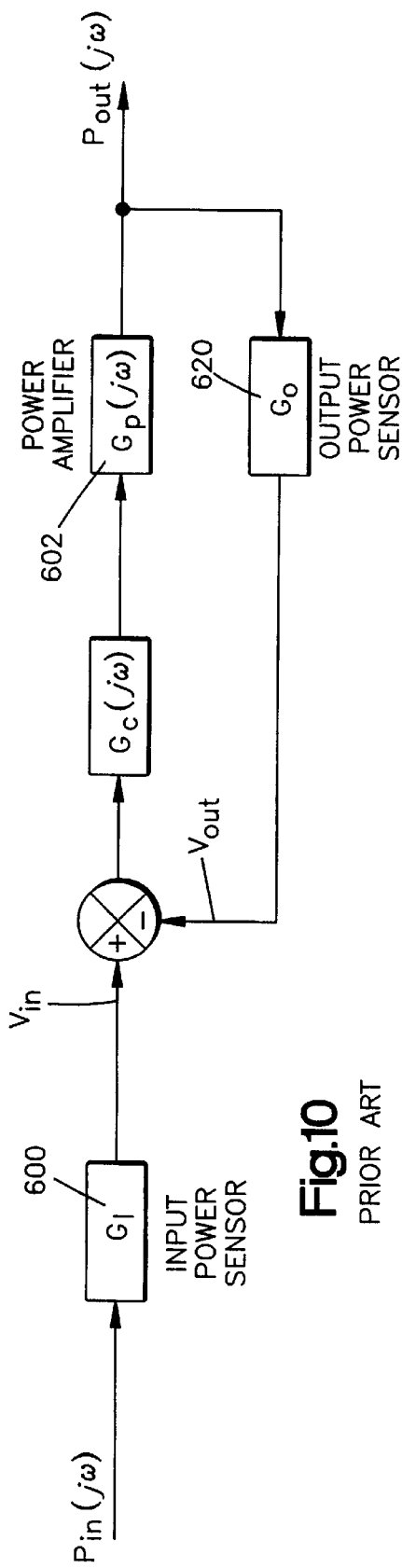
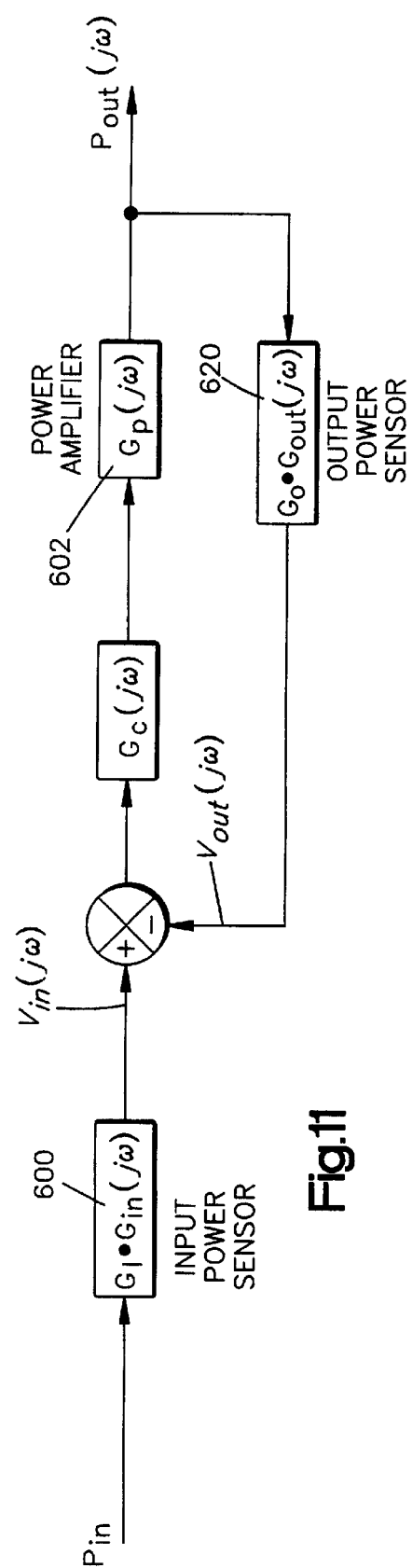
Fig.10 PRIOR ART
Fig.11

POWER AMPLIFIER SYSTEM HAVING FREQUENCY AND AMPLIFIER FAILURE COMPENSATION

RELATED APPLICATION

This is a continuation-in-part of our U.S. patent application Ser. No. 09/137,643, which was filed on Aug. 19, 1998 now U.S. Pat. No. 6,188,277.

TECHNICAL FIELD

The present invention is generally directed to an RF power amplifier with an automatic gain control system for use in amplifying an RF input signal and is more particularly directed toward frequency and amplifier failure compensation.

BACKGROUND OF THE INVENTION

RF power amplifier systems are known in the art for use in amplifying RF signals for broadcasting purposes, including radio and television. Such power amplifiers may be employed in the broadcasting of either analog television signals, known as the NTSC, PAL, SECAM format, or digital signals, sometimes known as DTV format. When employed in television broadcasting, the frequency bandwidth for the television signals is 6 MHz. The television channels will be in the UHF signal range from approximately 470 to 860 MHz.

The RF input signal to such a power amplifier is obtained from an RF exciter and, for example, this may take the form of a modulated RF carrier within a frequency band of 470 to 860 MHz with the bandwidth of any one channel being on the order of 6 MHz. This RF input signal may have a magnitude on the order of 20 milliwatts. This input signal is increased in magnitude to a much higher level such as on the order of 400 watts which represents a gain on the order of 43 dB.

These power amplifier systems are expected in many situations to be constantly operating so that a radio or television station employing such a power amplifier system may continuously broadcast.

Broad band RF power amplifiers are often required to have a flat gain over the specified frequency range. Usually, an automatic gain control (AGC) closed-loop system is used to control the gain of an amplifier. Most AGC closed-loop controllers are analog, however, the AGC can be digital by using a microprocessor for complex algorithms. A proportional integral derivative (PID) algorithm based AGC closed-loop controller can be used to control the gain of a power amplifier. A PID controller for AGC, which includes both analog and digital components, can automatically adjust the gain, compensating for the variations caused by the temperature changes or a power supply voltage change. It has been widely used in industrial control.

The regular closed-loop AGC control system of a RF power amplifier operating at nominal frequency can be described in the block diagram of FIG. 10 and Equation A.

$$\frac{P_{out}(j\omega)}{P_{in}(j\omega)} = \frac{G_I \cdot G_C(j\omega) \cdot G_P(j\omega)}{1 + G_O \cdot G_C(j\omega) \cdot G_P(j\omega)} \quad \text{Equation A}$$

The ideal RF sensor characteristics are:

$$V_{in} = G_I * P_{in} \quad \text{Expression (1)}$$

$$V_{out} = G_O * P_{out} \quad \text{Expression (2)}$$

Here,

| | |
|---|---|
| $\omega$: | Frequency ($\omega = 2\pi f$) |
| $P_{in}(j\omega)$: | Input power signal at nominal frequency |
| $P_{out}(j\omega)$: | Output power signal from amplifier 602 at nominal frequency |
| $V_{in}$: | Voltage signal from input power sensor 600 at nominal frequency |
| $V_{out}$: | Voltage signal from output power sensor 620 at nominal frequency |
| $G_I = G_I(j\omega_N)$: | Transfer Function of input power sensor at nominal frequency |
| $G_O = G_O(j\omega_N)$: | Transfer Function of output power sensor at nominal frequency |
| $G_C(j\omega)$: | Transfer function of PID controller |
| $G_P(j\omega)$: | Transfer function for plant (controlled object) |
| $\omega_N$: | Nominal frequency |

The regular AGC closed-loop controller in FIG. 10 can not compensate the gain errors due to the variation of the characteristics of components, which are not inside the closed-loop or in the feedback loop of the control system. To make the AGC loop work properly and provide constant gain over wide frequency range, the characteristics of the input and output power sensors should be frequency-independent. The same power level should generate the same response from the sensor at all frequencies. Consequently, the accuracy of the closed-loop controller maintaining the gain constant over frequency will depend on the flatness of the power sensor frequency response.

The power sensors are not perfectly flat over frequency, which limits the possibility for the controller to maintain constant gain over frequency. In order for an RF amplifier system to operate at a given frequency, the power sensors have to be tuned by means of variable capacitors and/or variable resistors. Hence, they can only be used at a fixed frequency, if operated without any other compensation.

The amplifier itself can contain several sub-amplifiers, which work in parallel. The failure of one of them changes the overall gain. A simple AGC controller would restore the gain level by increasing the RF drive level. That would overdrive the working sub-amplifiers and sacrifice the overall performance. The degradation in performance can not be adjusted nor compensated by the AGC, since the amplifier is driven into non-linear working region.

A cancellation technique can be used to correct gain variations by correcting the variation of the input and output signals from the RF sensors, which are due to the frequency response of these sensors, before the signals are used for the PID AGC algorithm. A similar technique can be used to compensate the gain variation caused by sub-amplifier failure.

SUMMARY OF THE INVENTION

In accordance with one aspect of the present invention, a power amplifier system is provided for use in amplifying an RF input signal at a given operating frequency within a known range of frequencies. The system includes a signal modulator that receives and modifies an RF input signal and provides therefrom a modified first signal. At least one power amplifier is provided that receives and amplifies the modified first signal. A first power detector detects the input signal and provides therefrom an average input power signal representative of the average input power thereof. A second power detector is connected to the output of the amplifier and provides an output average power signal representative of the average output power thereof. A controller adjusts the magnitude of the average input power signal and adjusts the magnitude of the average output power signal as a function of the operating frequency. The controller compares the adjusted input average power signal with the adjusted output average power signal and controls the modulator in accordance therewith.

In accordance with a more limited aspect of the present invention, the power amplifier is comprised of a plurality of sub-power amplifiers connected together in parallel and wherein the controller monitors the operation of the sub-power amplifiers for determining whether any of the sub-power amplifiers exhibits a faulty condition and adjusting the magnitude of the output average power signal in accordance therewith.

BRIEF DESCRIPTION OF THE DRAWINGS

The foregoing and other advantages of the invention will become more readily apparent from the following description of the preferred embodiment of the invention as taken in conjunction with the accompanying drawings, which are a part hereof, and wherein:

FIG. 8 is a flow diagram of another routine involved in the invention;

FIG. 10 is a block diagram of a prior art closed-loop automatic gain control (AGC) control system for a power amplifier;

FIG. 11 is a block diagram similar to that of FIG. 10, but illustrating the manner in which the closed-loop gain is affected by the frequency dependent characteristics of sensors 600 and 620;

DESCRIPTION OF A PREFERRED EMBODIMENT

Figure 1:
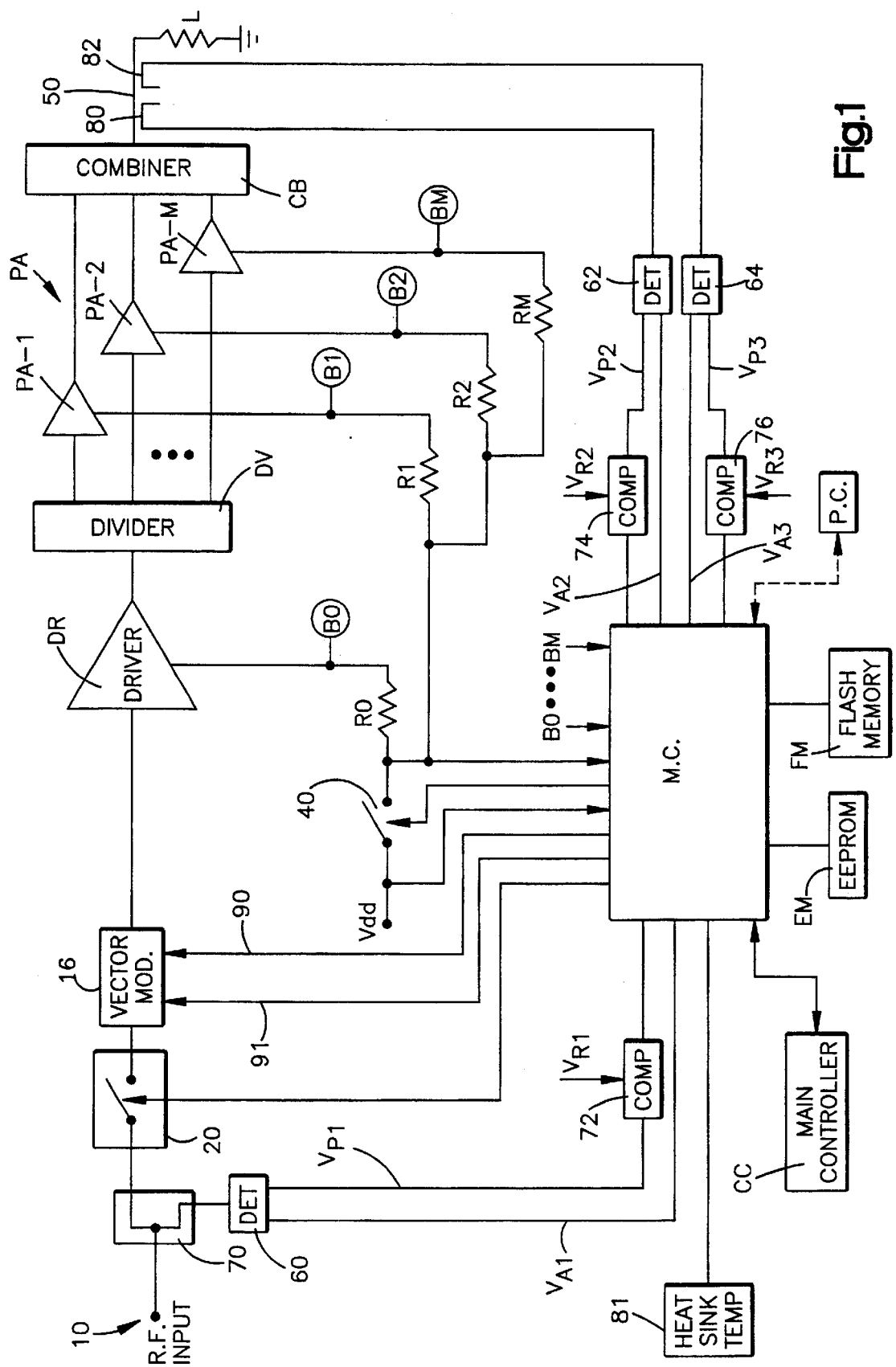
FIG. 1 is a schematic-block diagram illustration of apparatus employed in one embodiment of the invention.

Reference is now made to FIG. 1 which illustrates a power amplifier system which receives a modulated RF input signal at an input terminal 10 and amplifies the signal and supplies it to a load L, which may take the form of a transmitting antenna and associated equipment. As an example only, the RF input signal may have a magnitude on the order of 20 milliwatts and have a frequency within the UHF frequency range between 470 and 860 MHz with a 6 MHz bandwidth for the television channel involved. The signal may be increased by the amplifier with a gain on the order of 43 dB so that the output signal as applied to the load L may be on the order of 400 watts.

The RF input signal is applied to the input terminal 10 and, thence, to a vector modulator. The vector modulator changes the magnitude and the phase of the RF signal. The vector modulator is controlled by the vector signals $I_{VECTOR}$ and $Q_{VECTOR}$ 90 and 91, which are generated by a microcontroller MC. The modified RF signal from the vector modulator is then amplified by a driver DR to a higher level, such as 20 watts. The output, as taken from the driver DR, is then supplied to a power divider DV, sometimes referred to as a signal or power splitter, which divides the amplified signal by a factor of M. M signals are then applied to M sub-power amplifiers PA-1 through PA-M, where M, for example, may be 12. The signals from the sub-power amplifiers PA-1 through PA-M are then combined in a signal combiner CB to provide an output signal which is applied to the load L.

The input signal is applied to a vector modulator 16 when the RF input switch 20 is closed. The RF switch 20 is controlled by a microcontroller MC, as will be explained in greater detail hereinafter.

The driver DR amplifies the signal with a gain of approximately 14 dB to deliver an RF signal of approximately 20 watts to a divider DV. This divider serves as a power splitter and splits the applied RF signal into N portions. The divider applies N equal portions of the RF signal to respective sub-power amplifiers PA-1 through PA-M. Each sub-power amplifier may include a field effect transistor having its drain electrode connected through a suitable resistor, such as resistor R1 or R2 or RM, to a DC switch 40. When this switch is closed, it connects each drain electrode with a DC voltage source $V_{DD}$. This voltage source may, for example, be on the order of 32 volts.

The outputs from the power amplifiers PA-1 through PA-M are combined at the power combiner CB. The output signal at the output circuit 50 is on the order of 400 watts.

Figure 9B:
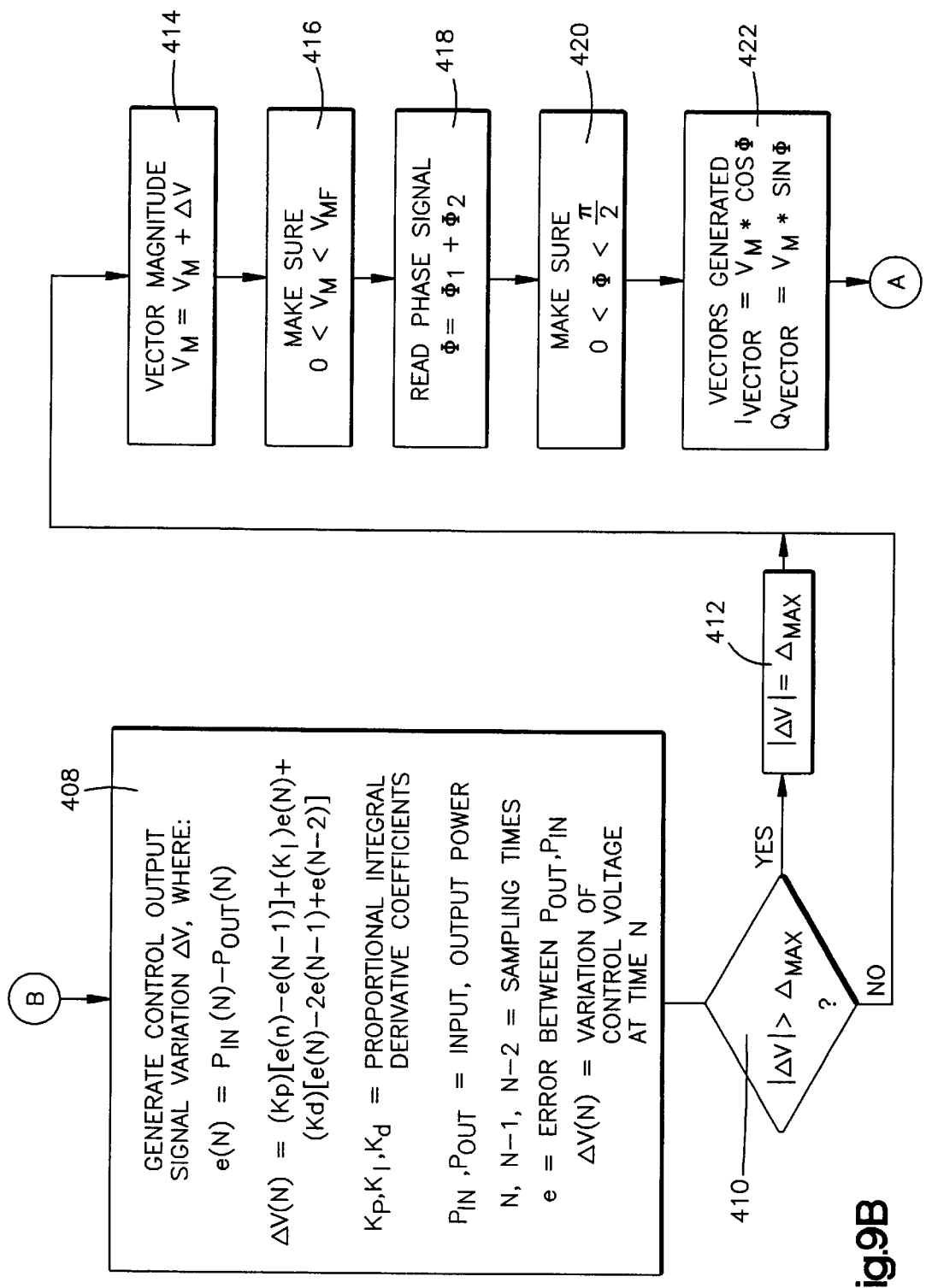
FIG. 9 is a flow diagram of another routine involved in the invention.

The microcontroller MC, together with input power detector 60, output power detector 62 and vector modulator 16, and driver DR, DV, and power amplifier PA-1 to PA-M and combiner CB, forms a closed-loop control system. The microcontroller MC uses proportional-integral-derivative algorithm based automatic gain control to adjust the gain of the power amplifier. Also, the microcontroller MC will adjust the phase of the output power based on the phase reference from external source. The vector signals $I_{VECTOR}$ and $Q_{VECTOR}$ 90 and 91, generated through the procedure FIG. 9B, control vector modulator 16, which thereafter controls the magnitude and phase of the output power of the power amplifier.

The microcontroller MC monitors the operation of the amplifier system and controls the operation of the RF switch 20 and the DC switch 40.

When the DC switch 40 is closed, current will flow in the power amplifiers PA-1 through PA-M. This current will flow through the associated resistors R1 through Rm. A voltage is developed across each resistor. These voltages are supplied as current samples to the microprocessor MC which then determines whether the current levels are too high or too low and takes appropriate action. Also, when the switch 40 is closed current flows through resistor R0 and the driver DR. The voltage developed across this resistor is also supplied to the microcontroller MC for analysis.

In addition to monitoring the current flowing through the various power amplifiers, the microcontroller also monitors peak and average power levels with the use of power detectors. These detectors include an input power detector 60 and output power detectors 62 and 64. The power detector 60 is connected to an input signal divider 70 and serves to provide DC output signals $V_{P1}$ and $V_{A1}$ respectively representative of the input peak power and the input average power. The signal representative of the input peak power $V_{P1}$ is compared with a reference $V_{R1}$ at comparator 72. If the peak power $V_{P1}$ exceeds the reference then an interrupt signal is supplied to the microprocessor MC which interrupts the routine being processed and enters a fault process to turn the power amplifier system off.

Detector 62 is connected to a incident signal coupler 80 coupled to the output transmission line 50. This detector 62 provides a DC voltage signal $V_{P2}$ representative of the peak output power as well as a DC voltage $V_{A2}$ which represents the average output power in the forward direction at the output transmission line 50. Signal $V_{P2}$ is compared with a reference $V_{R2}$ at comparator 74. If signal $V_{P2}$ exceeds reference $V_{R2}$ then an interrupt signal is supplied to microcontroller MC which then enters a fault process routine to turn the power amplifier off.

A coupler 82 is employed for sensing the reflected power and this coupler is connected to detector 64. This detector 64 serves to provide DC voltage signals including a signal $V_{P3}$ representative of the peak reflected power and $V_{A3}$ representative of the average reflected power. If signal $V_{P3}$ exceeds a reference $V_{R3}$, then comparator 76 applies an interrupt signal to the microcontroller MC which then enters a fault process routine to turn the power amplifier off. The monitored average power signals $V_{A1}$, $V_{A2}$ and $V_{A3}$ are supplied to the microcontroller MC which uses PID based automatic gain control to vary the gain and/or phase of the RF signal as needed.

Power Detector

Figure 2:
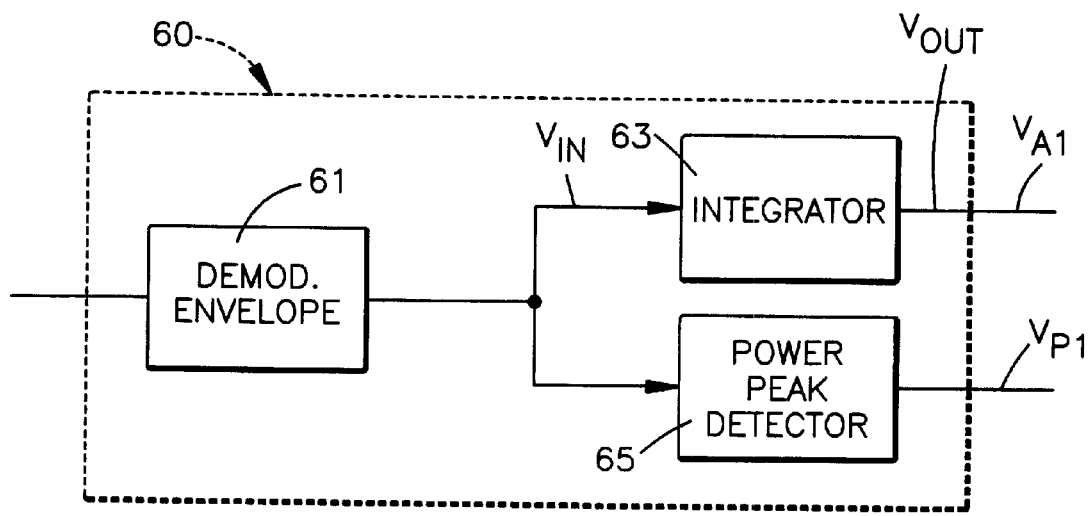
FIG. 2 is a block diagram of a detector in accordance with the invention.

Each of the power detectors is constructed in the same fashion as detector 60 which is described in detail with reference to FIG. 2. This detector includes an envelope demodulator 61 which receives a sample of an RF signal from correspondingly input or output transmission lines. The carrier signal may, for example, be on the order of 600 MHz and the baseband for the television signal has a bandwidth of 6 MHz. The demodulator 61 effectively strips off the carrier signal (600 MHz) leaving only the demodulated baseband signal. This signal may be viewed as an analog positive signal and which is applied to the integrator 63 and a peak power detector 65.

The integrator 63 provides an output signal in the form of voltage $V_{A1}$ representative of the average input power whereas the peak detector 65 provides an output signal in the form of a voltage $V_{P1}$ representative of the peak input power. The demodulator 61 and the integrator 63 form an RMS detector.

Integrator

Figure 3:
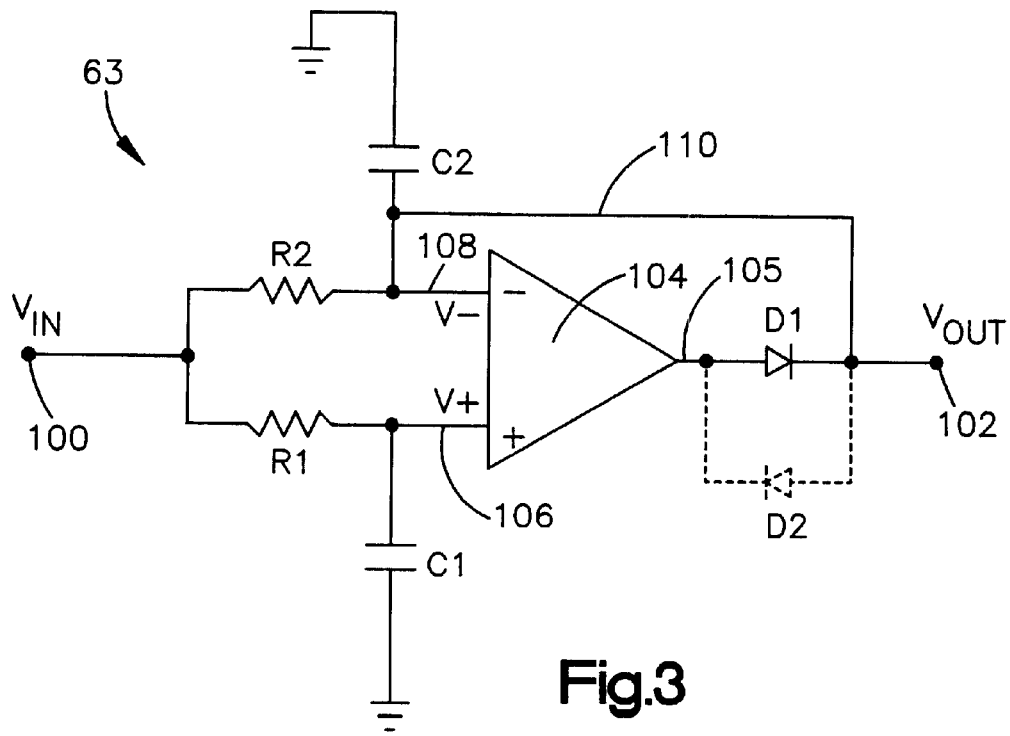
FIG. 3 is a schematic-block diagram of an integrator in accordance with the invention.

The integrator 63 located in each of the detectors 60, 62 and 64 may take the form as illustrated in FIG. 3 to be described below.

As will be recalled, the digital 8-VSB format refers to an 8 level vestigial sideband signal. The baseband of this signal is 6 MHz wide. It is desired to provide efficient power level control of the power amplifier system illustrated in FIG. 1. To achieve this, it is desirous to provide a power detector that provides an output signal, $V_{out}$, which is proportional to the corresponding average power. In the past, circuit designers have typically employed true RMS detectors for converting an input baseband signal into a DC level proportional to the RMS power. This is done in accordance with the equation noted below.

$$V_{RMS} = \frac{\sqrt{\int^T V_{in}^2 dt}}{T}$$

A significant problem in a power amplifier system as shown in FIG. 1 is the complexity and expense of the circuitry to perform the above equation. At present, commercially available integrated circuits that perform this type of an equation are only suitable for use at low frequencies, such as up to 10 kHz. As such, they are not able to provide an RMS signal representative of a baseband signal that is of a substantially higher frequency, such as being 6 MHz wide as in the case of digital television signals. There is a need to provide a circuit that will deliver an output voltage $V_{out}$ which is proportional to the RMS value of the input voltage $V_{in}$ without employing multiplication (such as $V_{in}$ times $V_{in}$ to obtain $V_{in}^2$). This is achieved with the circuit shown in FIG. 3 as described below.

The input voltage $V_{in}$ is applied to an input terminal 100 and the output voltage $V_{out}$ is obtained at an output terminal 102. A wideband operational amplifier 104 is provided having an RC charge path connected to its positive or non-inverting input 106 and an RC discharge path is connected to its inverting or negative input 108. The charge path includes a resistor R1 and a capacitor C1 having their junction point connected to input 106 of amplifier 104. The other side of capacitor C1 is connected to circuit ground. The discharge path includes a resistor R2 and a capacitor C2 having their junction point connected to input 108 of the operational amplifier 104. The other side of capacitor C2 is connected to circuit ground. A diode D1 is connected between the output 105 of amplifier 104 and the circuit output 102. The circuit output 102 is connected to the negative input 108 of the amplifier 104 by way of a circuit path 110.

The circuit in FIG. 3 has separate RC circuits that define the charge and discharge time constants and thereby provides independently controlled charge and discharge times. The circuit may be tuned by changing the value of resistors R1 and R2 so that the ratio of the charge and discharge time constants allows the detector to deliver an output voltage $V_{out}$ proportional to the RMS value of $V_{in}$. The manner of operation involved is presented below.

Consider a situation wherein the diode D1 is connected between output 105 and circuit output 102 and that $R2*C2 \geqq R1*C1$.

In this situation, the voltages $V_{out}$ and V− will follow voltage V+ as voltage V+ increases. The moment voltage V+ decreases, voltage $V_{out}$ follows the discharge time $R2*C2$ until V+ increases again and the operation repeats. Since voltage V+ follows voltage $V_{in}$ with a charge time constant $R1*C1$, then voltage $V_{out}$ follows voltage $V_{in}$ with the $C1*R1$ time constant on the rise and the $C2*R2$ time constant on the voltage $V_{in}$ fall.

When the R2*C2 time constant is long enough $$\left(\frac{1}{C2*R2} < f_{low}\right)$$

where $f_{low}$ is the lowest frequency in the spectrum of the envelope demodulated signal) this allows creation of the voltage $V_{out}$ anywhere in the range from voltage $V_{in}$ max. to voltage $V_{in}$ average by manipulating the C1*R1 time constant from C1*R1=0 to C1*R1=C2*R2.

If the diode D1 is replaced by diode D2 (as shown by the broken line) the condition R1*C1≧R2*C2 results. If R1*C1 is long enough $$\left(\frac{1}{C1*R1} < f_{low}\right)$$

then this allows creation of voltage $V_{out}$ anywhere in the range from $V_{in}$ average to $V_{in}$ minimum, varying C2*R2 from =C1*R1 to zero.

In the power amplifier system of FIG. 1, it is contemplated that an 8-VSB baseband signal is involved. It's spectrum looks like white noise with a frequency range from 0 to 6 MHz and almost even distribution of power within the range. The goal is to tune the ratio of charge and discharge time constants for the detector to deliver voltage $V_{out}$ proportional to the RMS value of voltage $V_{in}$ without going through a multiplication ($V_{in}*V_{in}$), which would require circuit complication.

This is achieved by referencing voltage $V_{out}$ originated by 8-VSB modulated RF to voltage $V_{out}$ originated by CW. Since the modulation baseband of the nonmodulated (CW) RF signal is equal to zero, voltage $V_{in}$ is a DC voltage. The RMS value for the DC voltage is equal to the voltage itself. Applied as voltage $V_{in}$, it will appear as $V_{out}=V_{in}$ on the output of the detector. The level of this voltage $V_{out}$ can be used as a reference of RMS voltage for a given average power of RF and, after switching from CW to 8-VSB signal with the same average power level, tune the time constants so that the voltage $V_{out}$ shows the same value.

The way to tune the time constants is to adjust the values of resistors R1 and R2 to achieve a certain voltage $V_{out}$. Thus, the RMS detector delivers true RMS value for two kinds of RF modulations: CW (no modulation) and 8-VSB.

Another explanation that may be employed for understanding the circuitry of FIG. 3 is now presented. A nonmodulated continuous wave (CW) signal of a known power level $P_r$ may be applied to the RF input terminal 10 (see FIG. 1). The value of voltage $V_{out}$ is observed. The continuous wave may then be replaced with an 8-VSB source of the same known power level $P_r$. Again, the output voltage $V_{out}$ is observed. Since the input power levels were the same $P_r$, the value of voltage $V_{out}$ should be the same for both cases. If it is not the same, then the values of resistor R1 and R2 in the charge and discharge paths, are varied to change the ratio of the charge and discharge time constants. Once the output voltages are the same then the values of the resistors are fixed and thus they have been optimized to achieve the same voltage $V_{out}$ for both CW and 8-VSB baseband signals.

Flow Diagrams

Reference is now made to the flow diagrams of FIG. 4 through FIG. 9 which illustrate the manner in which the microcontroller MC is programmed to accomplish various functions herein.

Figure 4:
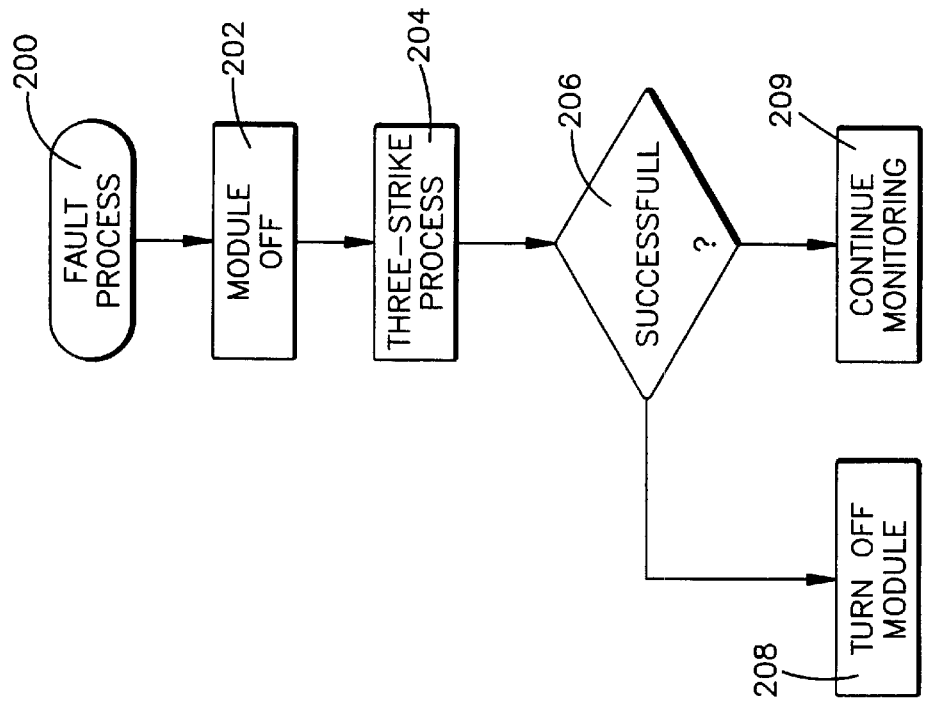
FIG. 4 is a flow diagram of one routine involved in the invention.

Attention is specifically directed to FIG. 4 which illustrates the flow diagram for the fault process routine 200 which is employed for turning off the power amplifier when a fault condition has been determined. In step 202, a "module off" indication has been made because a condition (to be discussed in greater detail hereinafter) has been determined to be a fault and the module (i.e. the power amplifier of FIG. 1) is to be turned off. This may be accomplished by the microcontroller MC controlling the RF switch 20 and the DC switch 40 by opening the switches and by adjusting the modulator 16 for minimum gain.

The procedure then steps to a three-strike process 204 during which the power amplifier is turned on and the conditions are again monitored to determine if there is a fault condition. In this case, the power amplifier is turned on up to three times over a 10 second interval to determine whether the fault condition is still present.

Thereafter, the procedure advances to step 206 which determines whether the power amplifier has been successfully turned on during the three-strike process. If it has been successful, then the procedure advances to step 209 and continues monitoring. If the attempt to restart the power amplifier is not successful, then the procedure advances to step 208 during which the power amplifier is shut down and not restarted. This shut down procedure involves the microcontroller commanding the RF switch 20 to open and commanding the DC switch 40 to open as well as turning down the gain of the vector modulator 16.

Figure 5:
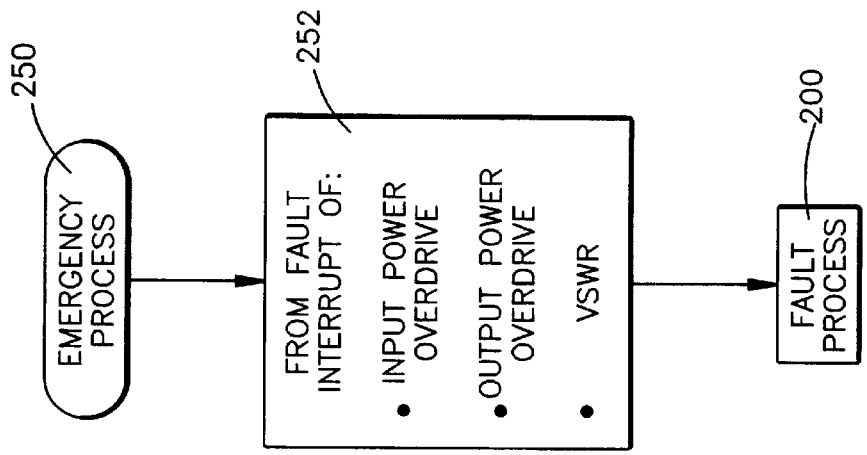
FIG. 5 is a flow diagram of another routine involved in the invention.

Reference is now made to FIG. 5 which illustrates an emergency process routine 250 which is employed by the microcontroller in the event that emergency level faults have been detected. This routine includes step 252 during which the microcontroller responds to an interrupt signal received from one of the peak power comparators 72, 74 or 76 to interrupt the microcontroller and enter into the fault process routine 200, described above with reference to FIG. 4, for purposes of turning off the power amplifier module of FIG. 1. As will be recalled, comparator 72 provides such an interrupt signal when the input peak power signal $V_{P1}$ is greater than a reference signal $V_{R1}$. Similarly, comparator 74 provides such an interrupt signal when the output forward peak power signal $V_{P2}$ exceeds a reference $V_{R2}$. Also comparator 76 provides such an interrupt signal when the reflected peak power signal $V_{P3}$ exceeds a reference $V_{R3}$ (representative of a VSWR excessive condition).

Figure 6:
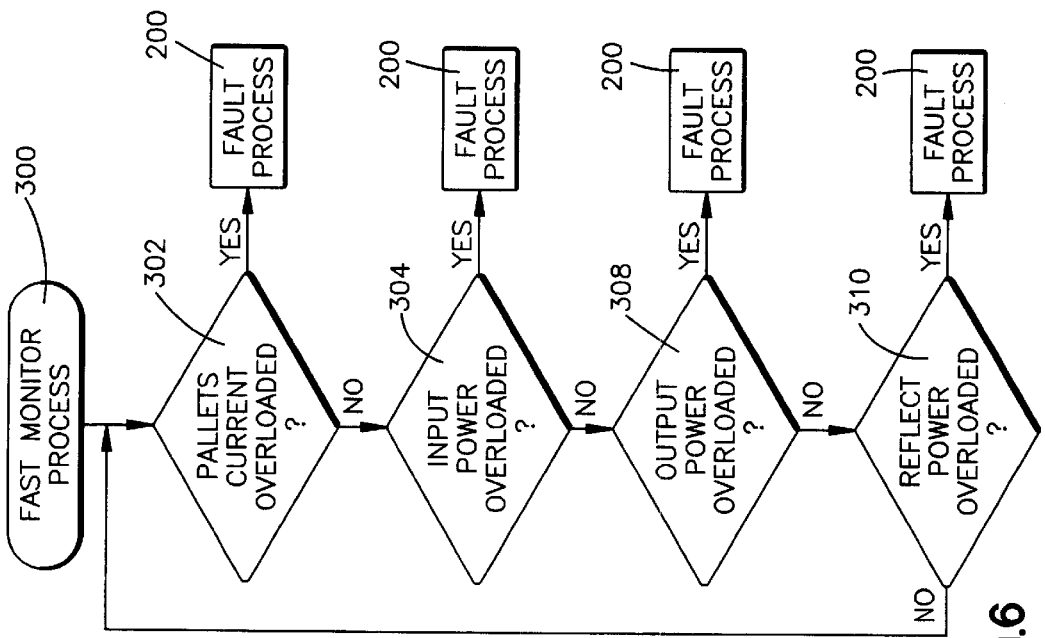
FIG. 6 is a flow diagram of another routine involved in the invention.

Reference is now made to FIG. 6 which illustrates a fast monitor process routine 300. In this routine, a determination is made at step 302 as to whether any of the pallets or sub-power amplifiers PA-1 through PA-M have an overloaded current condition. If so, then the procedure advances to the fault process 200 (see FIG. 4). If not, the procedure advances to step 304.

Figure 7:
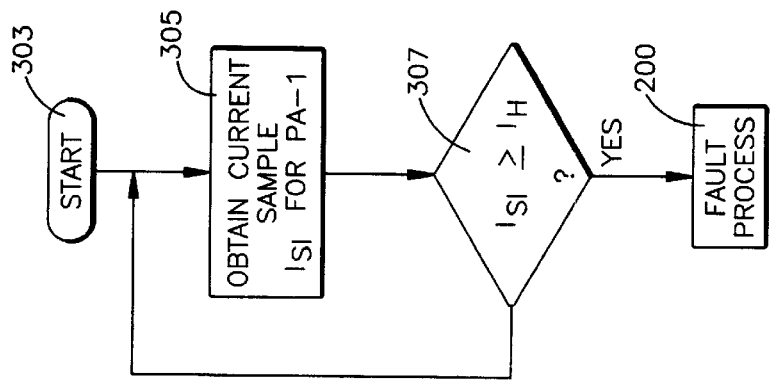
FIG. 7 is a flow diagram of another routine involved in the invention.

Before proceeding with step 304 attention is now directed to FIG. 7 which illustrates a routine for determining whether one of the sub-power amplifiers PA-1 through PA-M has an over-current condition. This routine commences with a start step 303 and, in the monitoring operation, a current sample $I_{S1}$ representative of the current flowing in the sub-power amplifier PA-1 is obtained in step 305. In step 307, the current sample $I_{S1}$ is compared with a reference sample $I_H$ representative of a high level of acceptance. If the current sample exceeds this high level, the procedure advances to the fault process 200 discussed hereinbefore with reference to FIG. 4. This type of routine may be practiced for monitoring each of the sub-power amplifiers PA-1 through PA-M.

Attention is again directed to routine 300 in FIG. 6. If none of the power amplifiers are current overloaded, as determined in step 302, the procedure advances to step 304 wherein a determination is made as to whether the input power is overloaded. In this step, a signal representative of the average input power is signal $V_{A1}$ and this is compared with a reference of an acceptable level in the microcontroller MC. If an overload condition is determined, the procedure advances to the fault process 200.

If the input power is not overloaded, the procedure advances to step 308 at which a determination is made as to whether the output power is overloaded. This is accomplished by comparing the signal $V_{A2}$, representative of the average output power, with an acceptable reference level. If signal $V_{A2}$ exceeds the reference level, the procedure advances to the fault process routine 200. If not, then the procedure advances to step 310.

In step 310 a determination is made as to whether the reflected power is overloaded. This is determined by comparing the average reflected power signal $V_{A3}$ with a reference level and if the reflected power is overloaded, the procedure advances to the fault process routine 200.

Reference is now made to FIG. 8 which illustrates a slow monitor process routine 350. In this routine, a determination is made at step 352 as to whether the DC voltage ($V_{DD}$) is too high. This is accomplished by comparing the voltage with a reference level. If the voltage $V_{DD}$ is too high, the procedure advances to the fault process 200. If not, the procedure advances to step 354.

In step 354, a determination is made as to whether the heat sink temperature is too high. This is obtained by comparing a signal representative of the heat sink temperature from a suitable source 81 with a reference. If the heat sink is overloaded, the procedure advances to the fault process routine 200. Otherwise, the procedure advances to step 356.

In step 356, a determination is made as to whether there has been an automatic gain control failure (AGC failure). If so, the procedure advances to the fault process routine 200. Otherwise, the monitoring operation continues.

Reference is now made to FIG. 9 which illustrates the automatic gain control (AGC) routine 400. This procedure includes step 401 during which the average sub-PA current $I_{ave.}$ is determined for each sub-PA; that is determine the value of $I_i$ for from i=1 to i=M and then divide the sum by M, the total number of Sub-PA. The procedure then advances to step 403.

In step 403, a determination is made as to how many of the sub-PA (PA-1 through PA-M) failed. This is done by determining if the current $I_i$ at each sub power amplifier is equal to or less than $I_o$, where $I_o$ is a threshold for "zero" current and is set to a value on the order of 10% to 20% of $I_{ave.}$. Step 403 then sets K to the number of failed sub-PAs. The procedure then advances to step 405.

In step 405, a determination is made as to whether K exceeds X, where X is the maximum allowed number of failed sub-PAs. If "yes", the procedure advances to the fault process step 200. If the determination at step 405 is "no", the procedure advances to step 407.

In step 407, the value of the output power signal $P_{out}(N)$ is re-calculated by multiplying the measured value of the output power signal by the factor of $$\left[\frac{M}{M-K}\right]^2.$$

The procedure then advances to step 408.

In step 408, the control output signal variation $\Delta V$ is generated as presented in the block bearing the label 408.

The procedure then advances to step 410 at which a determination is made as to whether the absolute value of $\Delta V$ is greater than $\Delta_{MAX}$ (i.e. is $|\Delta V| > \Delta_{MAX}$). If so, the absolute value of $\Delta V$ (i.e. $|\Delta V|$) is made equal to the value of $\Delta_{MAX}$ in step 412.

The procedure then advances to step 414 wherein the magnitude of the control voltage vector $V_M$ is updated so that it is equal to $V_M + \Delta V$.

The procedure then advances to step 416 wherein a check is made that the control voltage vector $V_M$ is greater than 0 but is less than the full scale value of $V_M$ which is used herein as $V_{MF}$.

The procedure then advances to step 418 wherein the microcomputer reads the phase signals which are referred to as $\phi_1$ and $\phi_2$ from the external source (FIG. 1). These signals are used in the following. The procedure advances to step 420 wherein a determination is made that $\phi$ is greater than 0 but less than $$\frac{\pi}{2} \left( \text{i.e. } 0 < \phi < \frac{\pi}{2} \right).$$

The procedure than advance to step 422 wherein the vectors to be supplied to the vector modulator 16 are generated. This includes the $I_{vector}$ which is equal to $V_M \cos \phi$ and the $Q_{vector}$ which is equal to $V_M \sin \phi$.

The procedure now advances to step 424 wherein the $I_{vector}$ and the $Q_{vector}$ are supplied to the vector modulator 16 to vary the phase and gain of the signal being processed by the vector modulator 16.

Thereafter, the procedure advances to step 426 during which a suitable time, such as 20 milliseconds, is waited. Then, the procedure advances to step 428 during which a determination is made as to whether or not the AGC control has failed. If so, the procedure advances to the fault process procedure 200 (see FIG. 4).

Cancellation of the frequency response

To maintain the gain of the power amplifier constant at different operational frequencies, the cancellation technique employs compensation factors to correct the input and output power, then the PID AGC algorithm will use corrected data to generate control signals.

The closed-loop AGC control system, without using the cancellation technique for input and output power sensors can be described by the block diagram FIG. 11 and Equation B. Thus, the system closed-loop gain will be affected by the frequency characteristics of the sensors.

$$\frac{P_{out}(j\omega)}{P_{in}(j\omega)} = \frac{G_I \cdot G_{in}(j\omega) \cdot G_C(j\omega) \cdot G_P(j\omega)}{(1 + G_O \cdot G_{out}(j\omega) \cdot G_C(j\omega) \cdot G_P(j\omega))} \quad \text{Equation B}$$

The real RF sensor characteristics are:

$$V_{in}(j\omega) = G_{in}(j\omega) * G_I * P_{in} \quad \text{Expression (3)}$$

$$V_{out}(j\omega) = G_{out}(j\omega) * G_O * P_{out} \quad \text{Expression (4)}$$

Here, $P_{in}(j\omega)$: Input power signal as a function of frequency $P_{out}(j\omega)$: Output power signal as a function of frequency $G_I = G_I(j\omega_N)$: Transfer Function of input power sensor at nominal frequency $G_O = G_O(j\omega_N)$: Transfer Function of output power sensor at nominal frequency $G_{in}(j\omega)$: Gain factor of input power sensor due to frequency-dependency $G_{out}(j\omega)$: Gain factor of output power sensor due to frequency-dependency $G_I * G_{in}(j\omega)$: Transfer Function of input power sensor with frequency-dependence $G_O * G_{out}(j\omega)$: Transfer Function of output power sensor with frequency-dependence $V_{in}(j\omega)$: Voltage signal from input power sensor with frequency-dependence $V_{out}(j\omega)$: Voltage signal from output power sensor with frequency-dependence Since Equations A and B are different closed-loop transfer functions, a regular PID algorithm based AGC controller can not generate the same gain for the RF amplifier if it is operated at any frequency other than nominal frequency.

Figure 12:
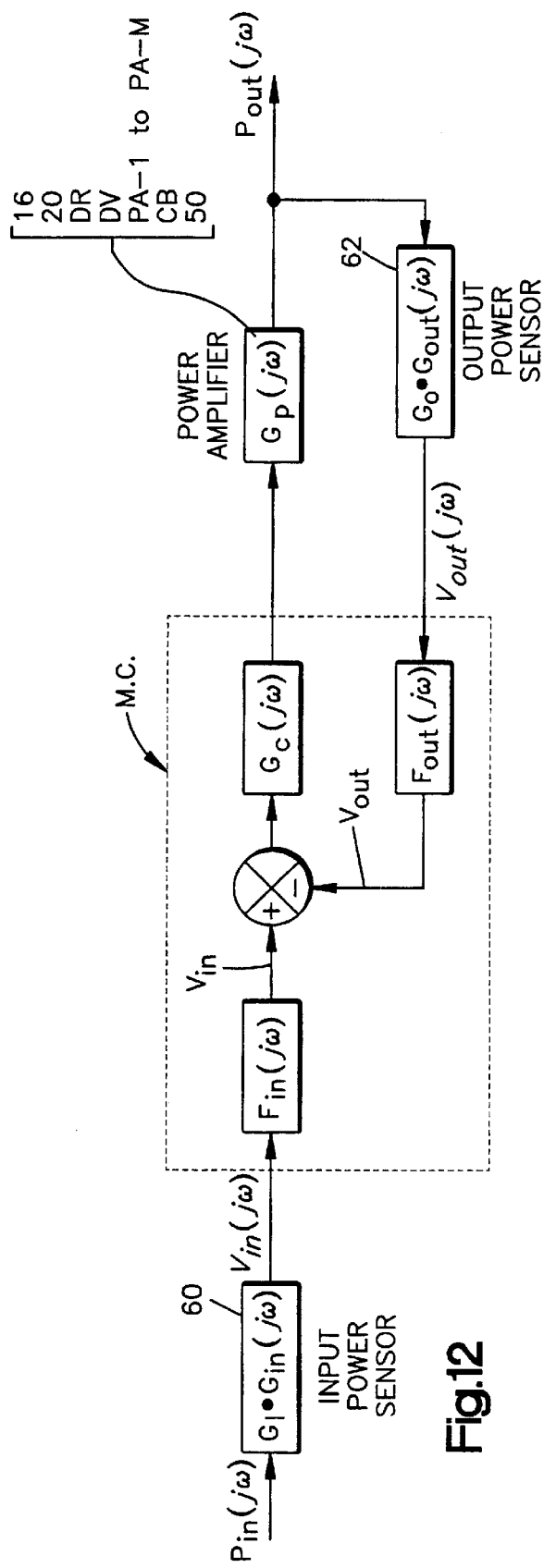
FIG. 12 is a block diagram based on FIG. 1 herein showing frequency compensation for the input power sensor 60 as well as for the output power sensor 62.

The closed-loop AGC control system using the cancellation technique for input and output power sensors can be described in the block diagram of FIG. 12 and Equation C.

$$\frac{P_{out}(j\omega)}{P_{in}(j\omega)} = \frac{G_I \cdot G_{in}(j\omega) \cdot F_{in}(j\omega) \cdot G_C(j\omega) \cdot G_P(j\omega)}{(1 + G_O \cdot G_{out}(j\omega) \cdot F_{out}(j\omega) \cdot G_C(j\omega) \cdot G_P(j\omega))} \quad \text{Equation C}$$

After compensation, the signals will be:

$$V'_{in}(j\omega) = F_{in}(j\omega) * V_{in}(j\omega) = F_{in}(j\omega) * G_{in}(j\omega) * G_I * P_{in} \quad \text{Expression (5)}$$

$$V'_{out}(j\omega) = F_{out}(j\omega) * V_{out}(j\omega) = F_{out}(j\omega) * G_{out}(j\omega) * G_O * P_{out} \quad \text{Expression (6)}$$

Here, $G_{in}(j\omega)$: Gain factor of input power sensor due to frequency-dependency $G_{out}(j\omega)$: Gain factor of output power sensor due to frequency-dependency $G_I = G_I(j\omega_N)$: Transfer Function of input power sensor at nominal frequency $G_O = G_O(j\omega_N)$: Transfer Function of output power sensor at nominal frequency $F_{in}(j\omega)$: Compensation factor function for input power sensor $F_{out}(j\omega)$: Compensation factor function for output power $P_{in} = P_{in}(j\omega_N)$: Input, power signal at nominal frequency $P_{out} = P_{out}(j\omega_N)$: Output power signal at nominal frequency $V_{in} = V_{in}(j\omega_N)$: Voltage signal from input power sensor at nominal frequency $V'_{in}(j\omega)$: Corrected voltage signal from input power sensor $V_{out} = V_{out}(j\omega_N)$: Voltage signal from output power sensor at nominal frequency $V'_{out}(j\omega)$: Corrected voltage signal from output power sensor $\omega_N$: Nominal frequency If, $$F_{in}(j\omega) * G_{in}(j\omega) = 1 \quad \text{Expression (7)}$$

$$F_{out}(j\omega) * G_{out}(j\omega) = 1 \quad \text{Expression (8)}$$

Then, $$V'_{in}(j\omega) = F_{in}(j\omega) * V_{in}(j\omega) = F_{in}(j\omega) * G_{in}(j\omega) * G_I * P_{in} = G_I * P_{in} = V_{in} \quad \text{Expression (9)}$$

$$V'_{out}(j\omega) = F_{out}(j\omega) * V_{out}(j\omega) = F_{out}(j\omega) * G_{out}(j\omega) * G_O * P_{out} = G_O * P_{out} = V_{out} \quad \text{Expression (10)}$$

Expressions 9 and 10 mean that any variations in the RF sensors' output due to frequency dependency will be canceled by a compensation factor function. After cancellation, the RF sensors seem working at nominal frequency all the time. Thus the RF sensors will be frequency-independent within the specified frequency range, this means the PID AGC algorithm and the RF power sensors can be used in a broad bandwidth.

From Expressions 7 and 8, the following conclusions can be drawn:

$$F_{in}(j\omega) = 1/G_{in}(j\omega) \quad \text{Expression (11)}$$

$$F_{out}(j\omega) = 1/G_{out}(j\omega) \quad \text{Expression (12)}$$

The inverse of the transfer function of the RF sensors is the compensation factors for the cancellation of the variation of input and output power caused by the sensors.

Thus, after cancellation Equation C can be rearranged as follows:

$$\frac{P_{out}(j\omega)}{P_{in}(j\omega)} = \frac{G_I \cdot G_C(j\omega) \cdot G_P(j\omega)}{1 + G_O \cdot G_C(j\omega) \cdot G_P(j\omega)} \quad \text{Equation C}$$

This equation Equation $C^1$ is identical to equation A. This means the compensated system operating at any given frequency will have the same closed-loop transfer function as a system operating at nominal frequency and these two systems will have the same gain under Automatic Gain Control.

In practice, the RF power amplifier will operate at a fixed frequency $\omega_0$ or $f_0$ once the operational frequency is set. Thus Expressions 7 and 8 can be modified as:

$$F_{in}(j\omega_0) = 1/G_{in}(j\omega_0) \quad \text{Expression (13)}$$

$$F_{out}(j\omega_0) = 1/G_{out}(j\omega_0) \quad \text{Expression (14)}$$

The characteristics of frequency response of RF sensors, $G_{in}(j\omega)$ and $G_{out}(j\omega)$, can be obtained through measurement. Since the frequency response of the RF sensors can not be described by simple closed-form formula they are presented in the format of data look-up table. Also, since the look-up table has non-continued discrete data points, an interpolation algorithm will be used to generate the correct factor at the exact frequency, even it may not be obtained directly from look-up table. Once the look-up tables of response vs. frequency are obtained, for any given frequency, the variation caused by the frequency dependency of the RF sensor can be compensated using this technique. Since the look-up tables are stored in non-volatile memory, they can be used to correct the frequency-dependent input power and output power sensors for any given operating frequency as long as the frequency is within the bandwidth.

Operating frequency set

To use the cancellation technique to compensate the frequency dependence of RF sensors, the operating frequency has to be set. The controller can use the cancellation technique to compensate the variation caused by the frequency via look-up table or equation. The operating frequency of the RF amplifier will be set via data communication from a PC or main controller to the micro-controller MC, in which a digital PID algorithm based AGC controller resides.

Once the operating frequency $f_0$ or $\omega_0$ is set or updated, the micro-controller calculates the frequency compensation factor $F_{in}(j\omega_0)$ and $F_{out}(j\omega_0)$. The setting frequency $f_0$ or $\omega_0$ is stored in non-volatile memory EEPROM. Every time the micro-controller restarts, the compensation factors $F_{in}(j\omega_0)$ and $F_{out}(j\omega_0)$ will be calculated at initialization time. During normal operation, the micro-controller uses the factors to compensate the input and output power for the iteration of the PID algorithm.

The microcontroller MC (FIG. 1) is also connected to a central or main controller CC by way of a serial bus that may take the form of a controller area network (CAN) serial bus. Additionally, the microcontroller MC could be connected by a serial communications network with a personal computer PC. The microcontroller is provided with memories including a EEPROM memory EM and a flash memory FM. These memories may be located externally of the microcontroller or internally thereof. The memory EM stores configuration information including the operational frequency $f_0$ for the power amplifier PA. The changes to be made in the frequency may be supplied from either the main controller CC or from the personal computer PC to the controller MC which then stores the new operating frequency $f_0$ in memory EM. The flash memory FM stores software codes as well as the look-up table LUT.

The look-up table LUT stores the frequency compensation correction factors employed for correcting the measured values of the input power signal $P_{IN}$ and output power $P_{OUT}$ as measured by the detectors 60 and 62. These correction factors are employed in Equation C herein. An example of the look-up table is presented in Table 1 below.

TABLE 1

(Look-up table LUT)

| $f(f = \omega/2\pi)$ MHz | $G_{in}(j\omega)$ | $F_{in}(j\omega)$ | $G_{out}(j\omega)$ | $F_{out}(j\omega)$ |
|---|---|---|---|---|
| 470 | 0.9925 | 1.0075 | 0.9193 | 1.0878 |
| 480 | 0.9883 | 1.0118 | 0.9323 | 1.0726 |
| 490 | 0.9899 | 1.0102 | 0.9452 | 1.0580 |
| 500 | 0.9943 | 1.0057 | 0.9469 | 1.0560 |
| 510 | 1.0005 | 0.9995 | 0.9577 | 1.0442 |
| 520 | 1.0092 | 0.9909 | 0.9720 | 1.0288 |
| 530 | 1.0166 | 0.9837 | 0.9824 | 1.0179 |
| 540 | 1.0168 | 0.9835 | 0.9937 | 1.0063 |
| 550 | 1.0101 | 0.9900 | 1.0000 | 1.0000 |
| 560 | 1.0000 | 1.0000 | 0.9988 | 1.0012 |
| 570 | 0.9889 | 1.1122 | 0.9950 | 1.0050 |
| 580 | 0.9797 | 1.0207 | 0.9985 | 1.0015 |
| 590 | 0.9740 | 1.0267 | 1.0073 | 0.9928 |
| 600 | 0.9691 | 1.0319 | 1.0150 | 0.9852 |
| 610 | 0.9675 | 1.0334 | 1.0219 | 0.9786 |
| 620 | 0.9664 | 1.0348 | 1.0219 | 0.9786 |
| 630 | 0.9704 | 1.0305 | 1.0133 | 0.9869 |
| 640 | 0.9776 | 1.0229 | 1.0030 | 0.9970 |
| 650 | 0.9872 | 1.0130 | 0.9990 | 1.0010 |
| 660 | 1.0170 | 0.9833 | 0.9410 | 1.0627 |
| 670 | 1.0220 | 0.9785 | 0.9480 | 1.0548 |
| 680 | 1.0220 | 0.9785 | 0.9620 | 1.0395 |
| 690 | 1.0170 | 0.9833 | 0.9720 | 1.0288 |
| 700 | 1.0090 | 0.9911 | 0.9840 | 1.0163 |
| 710 | 1.0030 | 0.9970 | 0.9970 | 1.0030 |
| 720 | 0.9990 | 1.0010 | 1.0100 | 0.9900 |
| 730 | 0.9970 | 1.0030 | 1.0230 | 0.9775 |
| 740 | 0.9950 | 1.0050 | 1.0340 | 0.9671 |
| 750 | 0.9960 | 1.0040 | 1.0460 | 0.9560 |
| 760 | 0.9990 | 1.0010 | 1.0580 | 0.9452 |
| 770 | 1.0010 | 0.9990 | 1.0640 | 0.9398 |
| 780 | 1.0020 | 0.9980 | 1.0760 | 0.9294 |
| 790 | 0.9950 | 1.0050 | 1.0820 | 0.9242 |
| 800 | 0.9790 | 1.0215 | 1.0800 | 0.9259 |
| 810 | 0.9680 | 1.0331 | 1.0780 | 0.9276 |

It is noted that the look-up table LUT in Table 1 provides correction factors for frequencies in the frequency range from 470 MHz to 810 MHz. Additionally, the frequencies shown are increased in value by 10 MHz at each step. It is to be appreciated that such a look-up table may include several more frequencies. With the frequency correction factors for the frequencies shown, it will be appreciated that for any frequency located between those shown in the Table, the value of the correction factors may be obtained through an interpolation algorithm, common in the art.

Figure 13:
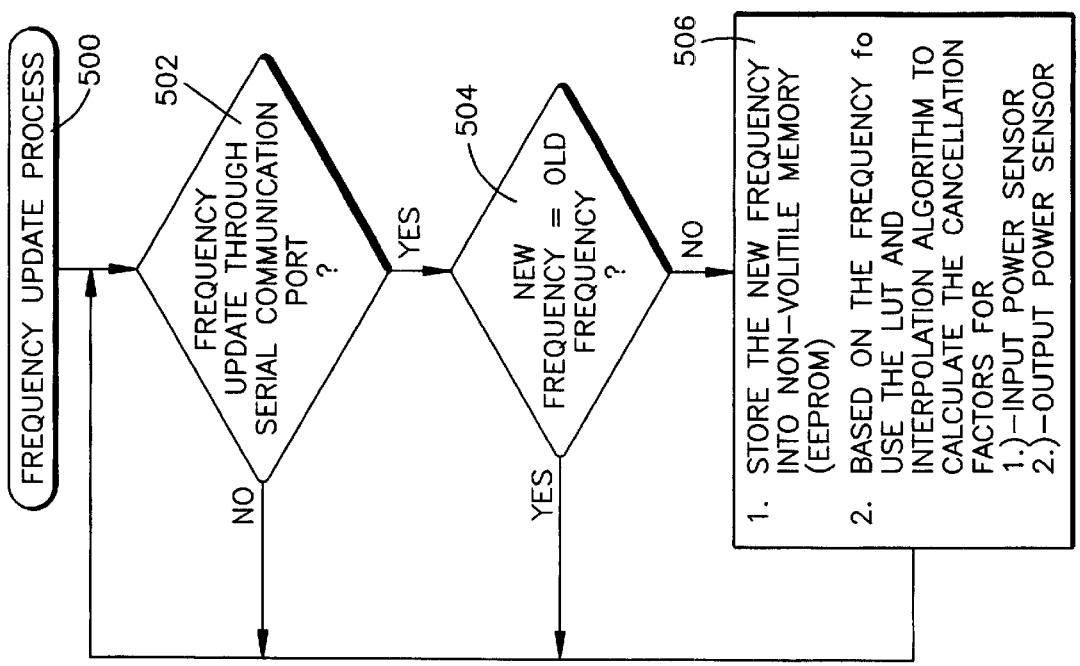
FIG. 13 is a flow diagram of another routine involved in the invention.

Reference is now made to the frequency update process routine 500 illustrated in FIG. 13. This process includes a step 502 during which the microcontroller determines whether a frequency update has taken place through a serial communications port from either the main controller CC or from the personal computer PC. If not, the process loops back to make another determination. If the determination in step 502 is affirmative, then the process advances to step 504.

In step 504, a determination is made as to whether the new frequency is equal to the old frequency. If so, then the procedure loops back to step 502. If the determination at step 504 is that the new frequency is not equal to the old frequency, then the procedure advances to step 506.

In step 506, the procedure stores the new frequency $f_0$ into the non-volatile memory (EEPROM) EM (FIG. 1). Based on the frequency $f_0$ in the look-up table LUT and a suitable interpolation algorithm, if needed, the correction factors are obtained for the input power sensor 60 and the output power sensor 62 and then the procedure loops back to step 502.

Figure 14:
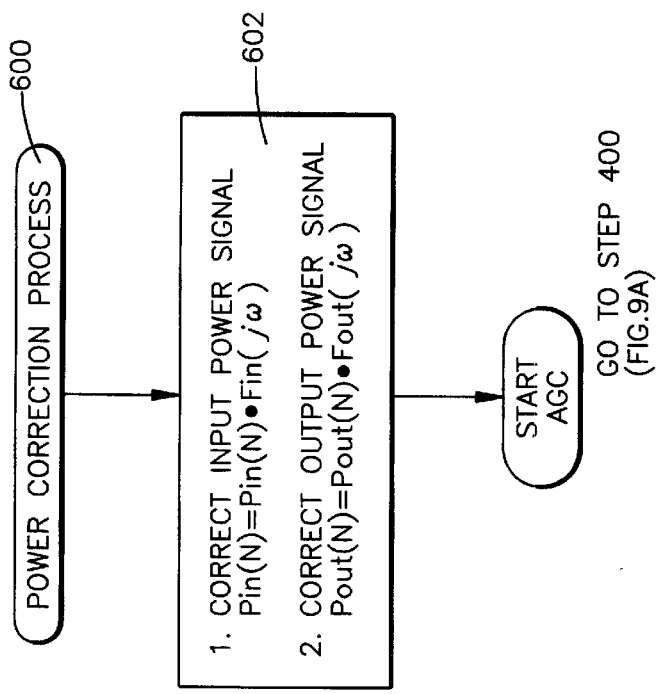
FIG. 14 is a flow diagram of another routine involved in the invention.

Reference is now made to FIG. 14 which illustrates a power correction process routine 600. This routine includes step 602 wherein the input power signal $P_{in}(N)$ is adjusted by multiplying the signal with the correction factor obtained from the look-up table (and further adjusted by interpolation if needed). Also, the output power signal $P_{out}(N)$ is corrected in a similar fashion by obtaining the correction factor at the operating frequency $f_0$. Now that the input and output power signals have been corrected to cancel the effects of frequency, the automatic gain control procedure at step 400 (FIG. 9A) is employed.

Cancellation of the failed sub-amplifier

For a power amplifier with many sub-amplifiers, the failure of some sub-amplifiers should not prevent the power amplifier from continuous operation and it should not prevent the AGC controller from working. Since the partial power loss of the power amplifier is a function of the number of failed sub-amplifiers, the total power reduction factor $F_1$ can be calculated from the total number of sub-amplifiers and the number of failed sub-amplifiers, which could be realized based on the sub-amplifiers' working conditions. Also, the power reduction factor is determined by the power combined scheme, it may be different if a different combined scheme is used.

Figure 15:
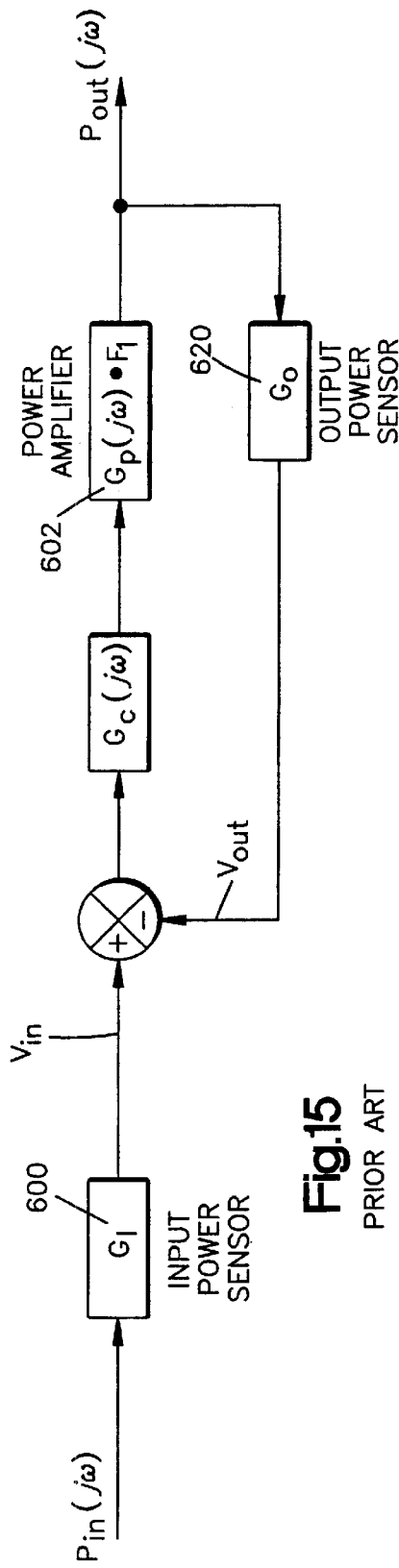
FIG. 15 is a block diagram of a prior art amplifier system similar to that as shown in FIG. 10, but additionally illustrating power reduction factor $F_1$ caused by the failure of one or more sub-amplifiers.

The regular closed-loop AGC control system with failed sub-amplifiers can be described by the block diagram FIG. 15 and Equation D.

$$\frac{P_{out}(j\omega)}{P_{in}(j\omega)} = \frac{G_I \cdot G_C(j\omega) \cdot G_P(j\omega) \cdot F_1}{(1 + G_O \cdot F_1 \cdot G_C(j\omega) \cdot G_P(j\omega))} \quad \text{Equation D}$$

By comparing Equation D with Equation A, it is seen that these two transfer functions have different forms, thus they will not have the same gain under same PID based AGC controller. Since the PID algorithm based AGC can not compensate for the gain errors caused by the sub-amplifiers failure to maintain the proper operation of the amplifier, the cancellation technique is used to correct either the input or output power for the PID algorithm.

Figure 16:
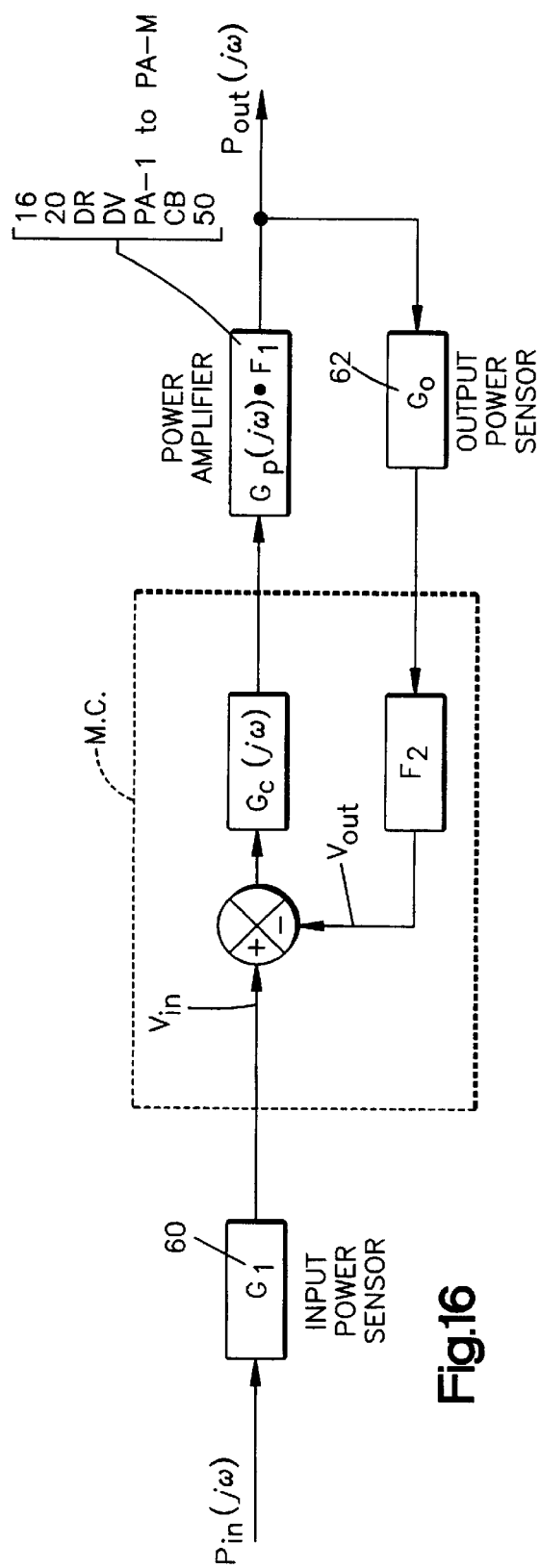
FIG. 16 is a block diagram based on the block diagram herein of FIG. 1 and illustrating that the power amplifier which is comprised of a plurality of parallel sub-power amplifiers PA-1 to PA-M and exhibits a power reduction factor $F_1$; and, FIG. 17 is a block diagram similar to that of FIG. 16 but showing both frequency compensation and sub-power amplifier compensation.

A compensation factor is added to provide the block diagram of FIG. 16 and equation E:

$$\frac{P_{out}(j\omega)}{P_{in}(j\omega)} = \frac{G_I \cdot G_C(j\omega) \cdot G_P(j\omega) \cdot F_1}{(1 + G_O \cdot F_1 \cdot G_C(j\omega) \cdot G_P(j\omega) \cdot F_2)} \quad \text{Equation E}$$

Here, $F_1 = [(M-K)/M]^2$: Power reduction factor caused by the failure of a number sub-amplifiers PA-1 to PA-M (FIG. 1)

$F_2$: Power compensation factor

M: Total number of sub-amplifiers

K: Number of failed sub-amplifiers

Thus, if we let $F_1 \cdot F_2 = 1$, or $$F_2 = 1/F_1 = \left[\frac{M}{M-K}\right]^2,$$

Equation E can be modified as:

$$\frac{P_{out}(j\omega)F_2}{P_{in}(j\omega)} = \frac{G_I \cdot G_C(j\omega) \cdot G_P(j\omega)}{1 + G_O \cdot G_C(j\omega) \cdot G_P(j\omega)} \qquad \text{Equation E}'$$

By comparing Equation $E^1$ with Equation A, it is seen that the right sides of the two equations are identical, this means the system with failed sub-PA will have the same transfer function as that of a normal system after the compensation. Thus the PID algorithm could still be used for Auto Gain Control. And the power amplifier can still operate normally at reduced power without any signal distortion or without the amplifier being over-driven.

Conclusion

Figure 17:
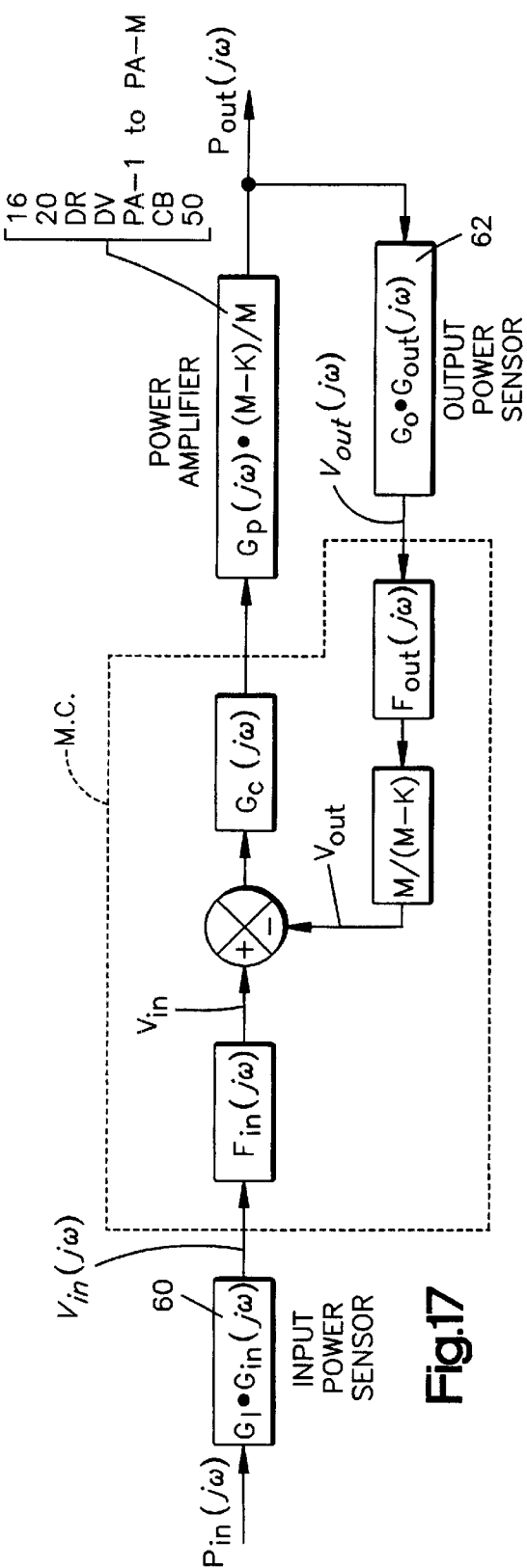

Overall compensated system can be described in block diagram FIG. 17 and Equation F.

$$\frac{P_{out}(j\omega)}{P_{in}(j\omega)} = \frac{G_I \cdot G_{in}(j\omega) \cdot F_{in}(j\omega) \cdot G_C(j\omega) \cdot G_P(j\omega) \cdot F_1}{(1 + G_O \cdot G_{out}(j\omega) \cdot F_{out}(j\omega) \cdot F_1 \cdot G_C(j\omega) \cdot G_P(j\omega) \cdot F_2)} \qquad \text{Equation F}$$

After cancellation, we have $$\frac{P_{out}(j\omega) \cdot F_2}{P_{in}(j\omega)} = \frac{G_I \cdot G_C(j\omega) \cdot G_P(j\omega)}{1 + G_O \cdot G_C(j\omega) \cdot G_P(j\omega)} \qquad \text{Equation F}'$$

If there is no failed sub-amplifier, which means K=0, $F_2=1$, the equation will be identical to Equation A.

Although the invention has been described in conjunction with a preferred embodiment, it is to be appreciated that various modifications may be made without departing from the spirit and scope of the invention as defined by the appended claims.

Having described the invention we claim:

1. A power amplifier system for use in amplifying an RF input signal exhibiting a given operating frequency within a known range of frequencies and comprising:
   a signal modulator that receives and modifies said input signal and provides therefrom a modified first signal;
   a power amplifier that receives and amplifies said modified first signal;
   a first power detector that detects said input signal and provides therefrom an average input power signal representative of the average input power thereof, and a second power detector connected to the output of said amplifier for providing an output average power signal representative of the average output power thereof;
   a controller that adjusts the magnitude of said average input power signal and the magnitude of said average output power signal as a function of the frequency level of said operating frequency to produce an adjusted input average power signal and an adjusted output average power signal; and,
   said controller includes a comparator that compares said adjusted input average power signal and said adjusted output average power signal and controls said modulator in accordance therewith.

2. A system as set forth in claim 1 including a memory that stores correction data for use by said controller to adjust the magnitude of said average input power signal and said average output power signal.

3. A system as set forth in claim 2 wherein said stored correction data includes data for adjusting the magnitude of said average input power signal and said average output power signal at each of a plurality of different frequencies within said known range of frequencies.

4. A system as set forth in claim 3 wherein said correction data includes a plurality of correction factors for adjusting said average input power signal at each of said plurality of frequencies.

5. A system as set forth in claim 4 wherein said controller adjusts the magnitude of said input average power signal by a said correction factor for the operating frequency in effect at that time.

6. A system as set forth in claim 5 wherein said adjusting is obtained by multiplying said correction factor for that frequency by the magnitude of the said input average power signal.

7. A system as set forth in claim 3 wherein said correction data includes a plurality of correction factors for adjusting said average output power signal at each of said plurality of frequencies.

8. A system as set forth in claim 7 wherein said controller adjusts the magnitude of said output average power signal by a said correction factor for the operating frequency then effect.

9. A system as set forth in claim 8 wherein said adjusting is obtained by multiplying the magnitude of said output average power signal by the correction factor for the frequency in effect at that time.

10. A system as set forth in claim 5 wherein said correction data includes a plurality of correction factors for adjusting said average output power signal at each of said plurality of frequencies.

11. A system as set forth in claim 10 wherein said controller adjusts the magnitude of said output average power signal by a said correction factor for the operating frequency then effect.

12. A system as set forth in claim 11 wherein said adjusting is obtained by multiplying the magnitude of said output average power signal by the correction factor for the frequency in effect at that time.

13. A system as set forth in claim 1 wherein said RF power amplifier is comprised of a plurality of sub-power amplifiers connected together in parallel and wherein said controller monitors the operation of said sub-power amplifiers for determining whether a fault condition exists at one or more of said sub-power amplifiers and adjusts the magnitude of said output average power signal in accordance with said determination.

14. A system as set forth in claim 13 wherein the number of sub-power amplifiers that have failed is K.

15. A system as set forth in claim 14 wherein the magnitude of the average output power signal is adjusted as a function of the number K.

16. A system as set forth in claim 14 wherein the average output power signal is adjusted by multiplying it by the factor $$\left[\frac{M}{M-K}\right]^2.$$

17. A system as set forth in claim 13 wherein said controller determines that a said sub-amplifier has failed when the magnitude of any current flowing therein is less than a threshold level.

18. A system as set forth in claim 13 wherein the number of sub-amplifiers that have failed is K.

19. A system as set forth in claim 18 wherein the average output power signal is adjusted as a function of the number K.

20. A system as set forth in claim 18 wherein the average output power signal is adjusted by multiplying it by the factor of $$\left[\frac{M}{M-K}\right]^2.$$

21. A system as set forth in claim 17 wherein said threshold level is related to the average of the magnitudes of all currents flowing in all of the operating ones of said M sub-amplifiers.

22. A system as set forth in claim 18 wherein said controller turns the amplifier system off if K exceeds a number representing the maximum allowable number of failed sub-amplifiers.

23. A system as set forth in claim 18 wherein said threshold level is related to the average of the magnitudes of all currents flowing in all of the operating ones of said M sub-amplifiers.

24. A system as set forth in claim 22 wherein the average output power signal is adjusted as a function of the number K.

25. A system as set forth in claim 24 wherein said average output power signal is adjusted by multiplying it by the factor of $$\left[\frac{M}{M-K}\right]^2.$$

26. A power amplifier system for use in amplifying an RF input signal exhibiting a given operating frequency within a known range of frequencies and comprising:

a signal modulator that receives control signals and modifies said input signal based on the control signals and provides therefrom a modified first signal;

a power amplifier that receives and amplifies said modified first signal;

a first power detector that detects said input signal and provides therefrom an average input power signal representative of the average input power thereof, and a second power detector connected to the output of said amplifier for providing an output average power signal representative of the average output power thereof;

a controller that adjusts the magnitude of said average input power signal and the magnitude of said average output power signal as a function of said operating frequency; and, said controller includes an automatic gain control scheme that compares said adjusted input average power signal and said adjusted output average power signal and controls said modulator in accordance therewith.

* * * * *